United States Patent [19]
Rossum

[11] 3,969,682
[45] July 13, 1976

[54] CIRCUIT FOR DYNAMIC CONTROL OF PHASE SHIFT

[75] Inventor: David Philip Rossum, Santa Clara, Calif.

[73] Assignee: Oberheim Electronics Inc., Santa Monica, Calif.

[22] Filed: Oct. 21, 1974

[21] Appl. No.: 516,744

[52] U.S. Cl. .................................. 330/85; 330/21; 330/31; 330/107
[51] Int. Cl.² .......................................... H03F 1/34
[58] Field of Search ............... 330/21, 31, 85, 107, 330/109; 328/167

[56] References Cited
UNITED STATES PATENTS

| | | | |
|---|---|---|---|
| 3,701,037 | 10/1972 | Holsinger | 330/107 |
| 3,715,678 | 2/1973 | Rekhard | 330/107 X |
| 3,786,363 | 1/1974 | Lelie | 330/107 X |
| 3,789,313 | 1/1974 | Sanderson | 330/107 |
| 3,792,367 | 2/1974 | Fleischer et al. | 330/98 |
| 3,805,091 | 4/1974 | Colin | 328/167 X |

OTHER PUBLICATIONS

"Controlled Active RC Filter Circuitry Gives Lab Unit Wide Applications," *Electronic Design 3*, Feb. 1, 1967, pp. 110, 112.

*Primary Examiner*—James B. Mullins
*Attorney, Agent, or Firm*—Lindenberg, Freilich, Wasserman, Rosen & Fernandez

[57] ABSTRACT

A current controlled variable transconductance amplifier having a differential input stage and a current source output stage is employed with negative feedback, either through a buffer amplifier or directly, to provide various all-pass, low-pass or high-pass filter configurations, each with controlled bias current to the differential input stage for current control of the variable transconductance amplifier to provide dynamic control of phase shift and filter cutoff frequency.

7 Claims, 9 Drawing Figures

CIRCUIT FOR DYNAMIC CONTROL OF PHASE SHIFT

BACKGROUND OF THE INVENTION

This invention relates to an electronic circuit for dynamic control of filtering and phase shift.

In many applications, such as in synthesizing sound or processing audio or analog signals, it is desirable to employ filters having variable phase shift or cut-off frequencies. While some control can be achieved in a filter circuit using variable resistors or capacitors, some noise and distortion may be experienced, or the circuit may be too expensive.

The classic phase-shift circuit is comprised of a differential operational amplifier with the input resistor, $R_A$, nominally equal to the feedback resistor, $R_B$. When a signal $V_{in} = V \sin \omega t$ is applied to the input, the output is:

$$V_{out} = V \sin [\omega t + \delta], \qquad 1.$$

where $\delta$ is equal to arctan $[2R_c C\omega/(R_c^2 C^2 \omega^2 - 1)]$ and $R_c$ is an input resistor connecting $V_{in}$ to the noninverting input of the amplifier, and the capacitor, C, is connected between that input terminal and circuit ground. Such phase shift stages can, of course, be cascaded to give arbitrarily large phase shifts.

Mixing the output of such a network with the original signal in a 1:1 ratio results in a comb filter response due to cancellation at all frequencies whose phase shift corresponds to an odd integral multiple of 180°. Dynamically shifting the location of the comb filter in the frequency spectrum produces a very interesting audio processing effect commonly called phasing. This is the major but not the only application of a dynamically controllable phase-shift circuit.

Traditionally, dynamic control has been effected by controlling the value of coupling resistor $R_c$ by various sorts of voltage controlled resistors. One approach has been the use of light variable resistors. This particular approach has the disadvantages of irreproducability and unreasonable expense. A lower cost approach is to use a field-effect transistor (FET) for $R_c$. This requires selection of FETs for proper characteristics, particularly when cascaded stages are used, and also gives noticeable distortion. The distortion may be compensated by several means, but these add to the cost of the circuit. In another approach to electronic control of phase shift disclosed in U.S. Pat. No. 3,475,623, the exponential volt-ampere characteristic of the base-emitter junction of a silicon junction transistor is employed as a voltage controlled resistor to provide a variable $R_c$ network, but that will not satisfy the need for an inexpensive, simple circuit capable of being easily implemented with either discrete components or integrated circuits, particularly in the case of an all-pass phase-shift circuit.

SUMMARY OF THE INVENTION

An object of this invention is to provide an inexpensive, simple filter circuit with electronic phase shift control.

Still another object is to provide wide dynamic control of phase shift in a filter with low noise and low distortion.

In accordance with the present invention a current controlled transconductance amplifier, comprising a differential input stage controlling bias current and a current-source output stage, is used with its output fed back to its inverting input and connected to a capacitor in different filter circuit configurations for dynamically controlled phase shift. The different filter configurations are achieved by connecting the other side of the capacitor to the input terminal of the filter circuit, while the input terminal of the filter circuit is connected to the inverting input terminal of the transconductance amplifier in the case of an all-pass filter, or not so connected in the case of a high-pass filter, or connecting the other side of the capacitor to circuit ground in the case of a low-pass filter. In the latter case, the circuit input terminal can be connected to the inverting or the non-inverting input terminal of the transconductance amplifier according to whether an inverting or noninverting filter is desired. The low-pass filter can be built in either an inverting or a non-inverting configuration; it can also be used in a differential configuration with two input signals one at each input terminal. When two or more stages are cascaded, negative feedback may be provided around the cascaded stages. The input signal should in all cases be such as to maintain the input signal to the transconductance amplifier within the linear region of its transfer characteristic.

A voltage dividing network may be used in the feedback circuit of the filter configurations, and a voltage dividing network may be used in the noninverting or inverting input. In the latter case, one resistor connected to circuit ground is common to both voltage dividing networks. The common resistor, and sometimes all such resistors, can be eliminated if the input signal is otherwise kept within a linear range of the transconductance amplifier. With the capacitor connected to circuit ground in a low-pass filter configuration, the noninverting buffer amplifier can be eliminated to provide feedback to the inverting input of the transconductance amplifier. The buffer amplifier may be omitted in still other configurations, depending upon the application of the circuit. In each case, the controlled bias current to the differential input stage provides current control of the variable transconductance of the operational transconductance amplifier for dynamic control of phase shift.

DESCRIPTION OF THE PREFERRED EMBODIMENTS

Figure 1:
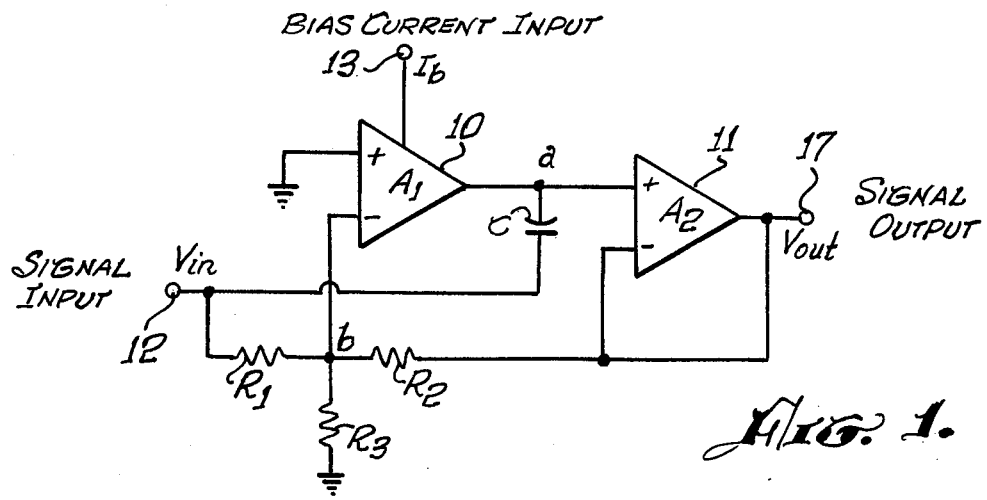
FIG. 1 shows an exemplary embodiment of the present invention in an electronically controlled all-pass filter.
Figure 4:
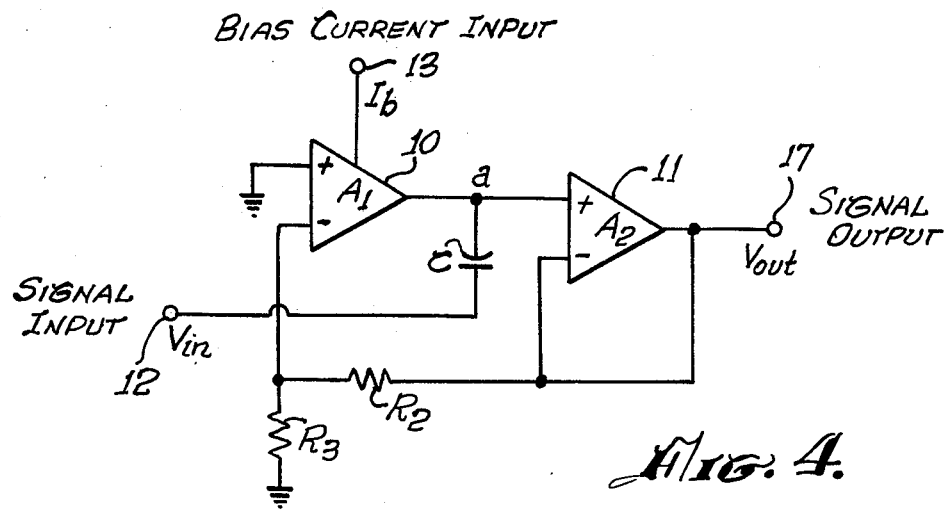
FIG. 4 shows a second embodiment of the invention in a high-pass filter.
Figure 5:
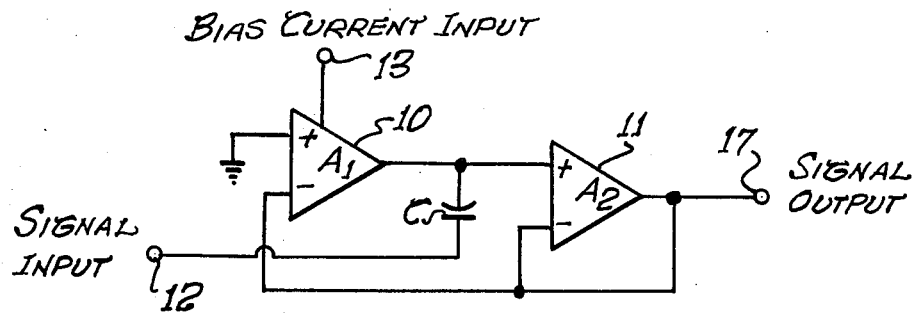
FIG. 5 shows a variant of the embodiment of FIG. 4.
Figure 6:
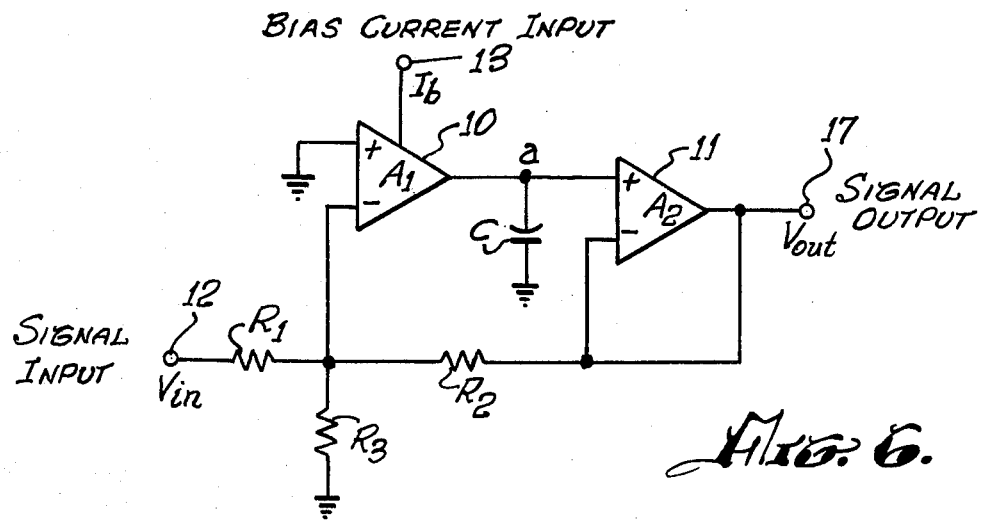
FIG. 6 shows a third embodiment of the invention in an inverting low-pass filter.

Referring to FIG. 1, the present invention involves the use of a current controlled, variable transconductance amplifier 10 having an output terminal connected to a capacitor, C, and a noninverting, unity-gain impedance buffer amplifier 11. In this embodiment, an input terminal 12 is connected to a node $b$ (summing junction) at the inverting (−) input terminal of the amplifier 10 through a resistor $R_1$ and to the capacitor to provide a phase shifter, i.e. to provide an all-pass filter in which all frequency characteristics are controlled uniformly in response to a bias current $I_b$ at an input terminal 13. In other embodiments, the input terminal 12 is connected only to the capacitor to provide a controlled high-pass filter, such as shown in FIG. 4, or the capacitor is connected to circuit ground to provide a controlled low-pass filter as shown in FIGS. 5 and 6.

Figure 2:
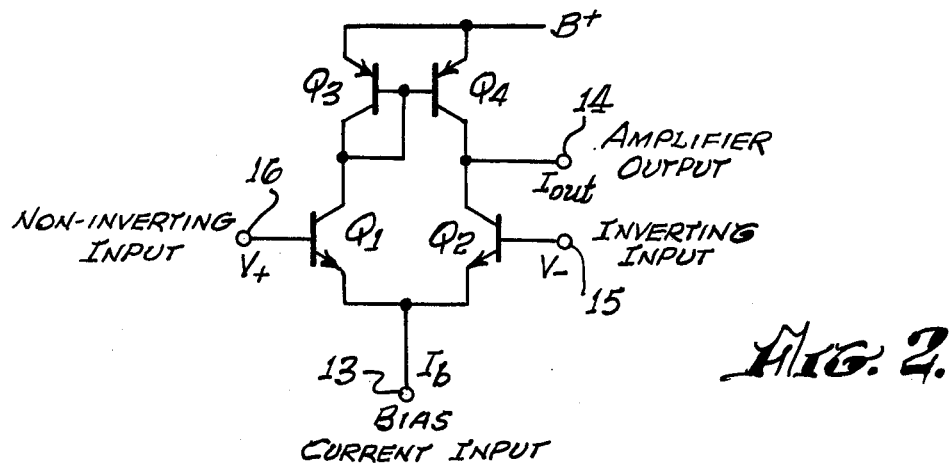
FIG. 2 is a circuit diagram of an exemplary operational transconductance amplifier used in the embodiment of FIG. 1 and other embodiments of the invention.

The amplifier 10 has a differential input stage and a current source output stage, and should have a transfer characteristic in the linear region of approximately:

$$I_{out} = g_{mr}(V_+ - V_-)I_b \qquad 2.$$

where $I_{out}$ is the amplifier output current, $g_{mr}$ is the transconductance at 1 mA bias current, $V_+$ and $V_-$ are the voltages at the respective inverting (−) and noninverting (+) input terminals, and $I_b$ is the bias or control current in milliamperes at the control terminal 13. FIG. 2 shows a simple discrete circuit for such an amplifier. Transistors $Q_1$ and $Q_2$ form a matched NPN differential pair. From the standard equation for a differential amplifier, the collector currents $I_c$ of respective transistors $Q_1$ and $Q_2$ are, for the linear region, given by the equations:

$$I_c(Q_1) = I_b/2 \times [1+(V_+ - V_-)]/52mV$$

$$I_c(Q_2) = I_b/2 \times [1+(V_- - V_+)]/52mV \qquad 3.$$

Transistors $Q_3$ and $Q_4$ are matched and form a current mirror, such that the collector current of transistor $Q_4$ equals that of transistor $Q_1$. Thus the current $I_{out}$ from an output port 14 is the difference of the above currents for transistors $Q_1$ and $Q_2$ given by the equation:

$$I_{out} = I_b(V_+ - V_-)/52mV \qquad 4.$$

where $V_+$ and $V_-$ are signals at respective inverting (−) and noninverting (+) input terminals 15 and 16. Alternatively, an integrated-circuit version of a variable tranconductance amplifier, such as the RCA CA3080 Operational Transconductance Amplifier, may be used for the amplifier 10.

Figure 3:
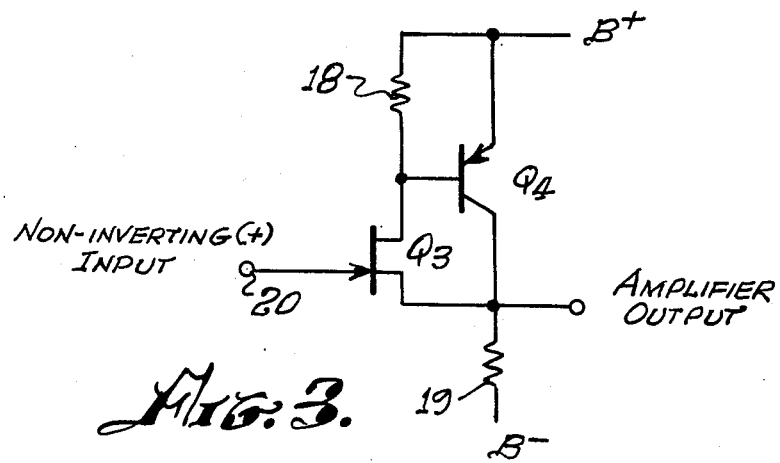
FIG. 3 is a circuit diagram of a non-inverting buffer amplifier used in the embodiment of FIG. 1 and some of the other embodiments of the invention.

The output of the amplifier 10 is connected to the noninverting (+) input terminal of the buffer amplifier 11. That amplifier can be any operational amplifier, such as a Fairchild 741 having differential inputs and a single ended output connected to a circuit output terminal 17 as shown, i.e. connected in a positive unity-gain configuration. Alternatively, a discrete circuit such as shown in FIG. 3 may be used. Transistor $Q_3$ is an N-channel, field-effect transistor (FET) operated in a source-follower mode, with the value of resistor 18 chosen to give a current somewhat less than the saturation current $I_{DSS}$ for all output voltages of interest. The value of resistor 19 is chosen to give a voltage $V_{BE}$ across a PNP transistor $Q_4$ of about 0.7V at the lowest output voltage of interest. The resulting feedback provides for an extremely low output impedance, and the FET input gives a very high input impedance to a signal at a terminal 20. In this discrete circuit, the output terminal 21 is also the inverting (−) input terminal shown in FIG. 1 and other figures. The output signal is substantially offset from the input signal, but this is of no consequence in the present invention as it will be compensated by negative feedback. Moreover, as will be explained further hereinafter, the buffer amplifier may be omitted in some applications.

To fully analyze the embodiment of FIG. 1, the current flow into node $a$ is examined. Amplifier 11 has a high input impedance, and hence draws essentially no current. The current entering node $a$ through capacitor C is derived from the equation for current through a capacitor.

$$I_c = C\, d(V_{in} - V_{out})/dt \qquad 5.$$

This is true because the voltage at node $a$ differs from $V_{out}$ by at most a constant voltage.

From equation (2) for the amplifier 10, the current flowing from that amplifier into node $a$ is:

$$I_{A1} = -I_b\, g_{mr}\, V_b \qquad 6.$$

where $V_b$ is the voltage at node $b$.

Letting the value of resistor $R_1$ equal that of resistor $R_2$, and setting the value of resistor $R_3$ at a level to keep the voltage at node $b$ in the linear region of the amplifier 10 for all output voltages of interest, we find the current node $a$ is:

$$I_{A1} = -I_b g_{mr}(V_{in}+V_{out})R_3/(R_2+R_3) \qquad 7.$$

Combining $g_{mr}$ and $R_3/(R_2+R_3)$ as a fixed constant K, an equation is finally obtained resulting from current balance at node $a$, as $I_{A1}$ must be opposite and of equal magnitude to $I_c$:

$$C\, d(V_{in}-V_{out})/dt = I_b K(V_{in}+V_{out}) \qquad 8.$$

Solving this differential equation for an input voltage $V_{in} = Ve^{j\omega t}$:

$$V_{out} = V e^{j\omega t}\, (j\omega - I_b K/C)/(j\omega + I_b K/C) \qquad 9.$$

Solving the complex equation for amplitude:

$$V_{out} = V \qquad 10.$$

and for phase shift:

$$\delta = \arctan\, 2C\omega/[I_b K(C^2\omega^2/I_b^2 K^2 - 1)] \qquad 11.$$

It will be noted that this is identical to equation (1) for the classic phase shift circuit of FIG. 1, with $R_c$ of that circuit substituted by $1/I_b K$. Hence a precise dynamic control of the phase shift is accomplished by merely varying the bias current $I_b$.

If the input signal at terminal 12 is already conditioned to be at a level within the linear region of the transconductance amplifier 10, the resistor $R_3$ could be omitted, leaving only the equal input resistor $R_1$ and feedback resistor $R_2$ as summing resistors. The term $R_3/(R_2+R_3)$ in equation (7) would effectively become equal to unity since the value of $R_3$ is thus increased toward infinity.

The greatest advantage of the present invention is its relative low cost, using integrated-circuits for amplifiers 10 and 11. With such low cost components, the circuit performs at least as well as virtually any other previously known. By replacing the integrated-circuit amplifiers with slightly more expensive discrete circuits, very low distortion, low noise, and ultra wide range can be accomplished.

Another advantage of the present invention is the highly predictable nature of the dynamic control, as K in the above equations is based on passive component values and physical constants, not on process-varying characteristics of transistors such as the base-emitter characteristics of a junction transistor. By using high quality amplifiers, the frequency characteristics of the filter circuit may be dynamically controlled over a continuous range of 20 octaves.

Various configurations embodying the present invention can result in various filter functions, the most interesting and useful of which is the phase-shift all-pass filter circuit just described with reference to FIG. 1 in which the capacitor is connected to the input signal, and the input signal is simultaneously fed through a resistor into the inverting input of the variable transconductance amplifier.

In other configurations to be described with reference to FIGS. 4 to 8, the same reference numerals will be employed for the same elements, the differences being only in the configuration into which the elements are connected.

FIG. 4 shows a second embodiment of the invention in a high-pass filter in which $R_1$ is made infinitely large (open circuit). Analysis is accomplished most easily by balancing the current flow at node $a$ as before. The current flowing into the node through the capacitor is:

$$I_c = C \, d(V_{in} - V_{out})/dt \qquad 12.$$

By using equation (2) for the variable transconductance amplifier the current flowing from the output of amplifier 10 is:

$$I_{A1} = -I_b g_{mr} V_{out} R_3/(R_2+R_3) \qquad 13.$$

Henc:

$$C \, d(V_{in}-V_{out})/dt = I_b K V_{out} \quad (K \text{ as before}) \qquad 14.$$

The solution is:

$$V_{out} = V \, e^{j\omega t} \, [j\omega/(j\omega + I_b K/C)]$$

$$|V_{out}| = V\omega / \sqrt{\omega^2 + I_b^2 K^2/C^2} \qquad 15.$$

$$\delta = \arctan[I_b K/C\omega]$$

This is the same solution as for a traditional high-pass filter.

If the input signal level is kept within the linear region of amplifier 10, the filter circuit of FIG. 4 can be simplified by setting $R_3$ equal to an infinitely large impedance (open circuit) and $R_2$ equal to zero (short circuit) as shown in FIG. 5.

FIG. 6 shows a low-pass filter circuit. Again, the circuit is analyzed by balancing the current to node $a$, giving the differential equation:

$$C dV_{out}/dt = I_b K(V_{in}-V_{out}) \qquad 16.$$

The solution:

$$V_{out} = V \, e^{j\omega t} \, [I_b K/[C(j\omega + I_b K/C)]]$$

$$|V_{out}| = V I_b K/[C \sqrt{\omega^2 + I_b^2 K^2/C^2}] \qquad 17.$$

$$\delta = -\arctan[C\omega/I_b K]$$

This is the solution of a classic RC low-pass filter equation with R substituted by $1/I_b K$.

Figure 7:
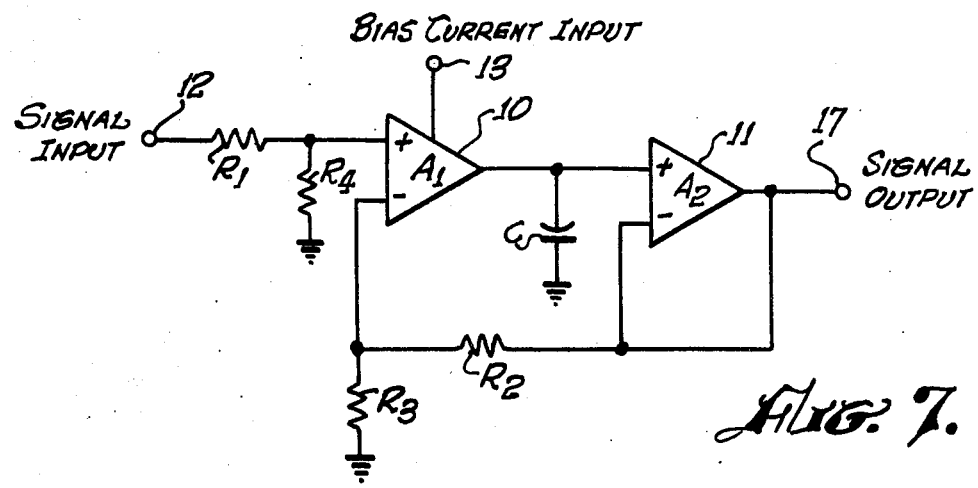
FIG. 7 shows the embodiment of FIG. 6 in a noninverting configuration.

The low-pass filter configuration of FIG. 6 is inverting. By changing the input configuration as shown in FIG. 7 with a resistor $R_4$ set equal to resistor $R_3$, a noninverting low-pass filter is obtained. Furthermore, if the input signal is kept within the linear region of the amplifier 10, both the input and feedback voltage dividing networks can be eliminated as shown in FIG. 8.

Figure 8:
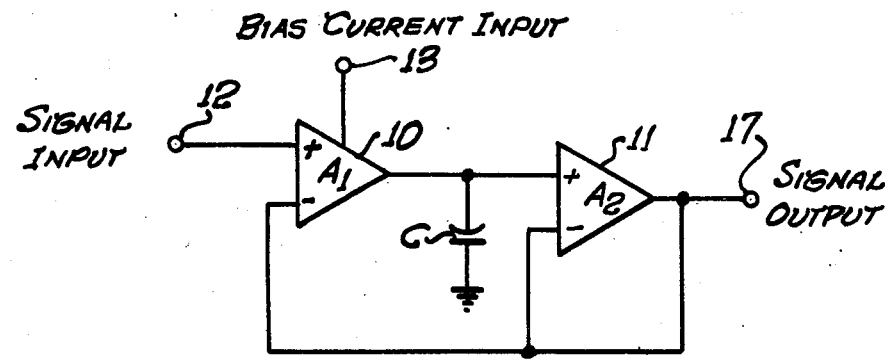
FIG. 8 shows a variant of the configuration of FIG. 7.
Figure 9:
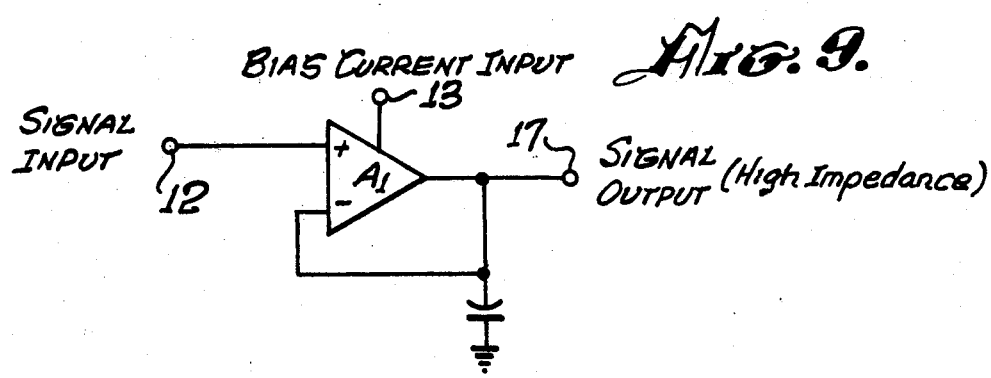
FIG. 9 shows a further variant of the configuration of FIG. 7.

A further simplification may be made in the low-pass filter of FIG. 8 by using the amplifier 10 both as the control element and as the buffer amplifier for the feedback signal. That is done by connecting the inverting input terminal (−) of the amplifier 10 to its output terminal, as shown in FIG. 9. This is useful for cascading stages, but naturally the final output must be connected to a high impedance load (i.e., must not be loaded with a circuit that draws too much current through a low impedance) or the load must be buffered with an amplifier having a high input impedance.

In each embodiment, the bias current $I_b$ is assumed to be controllable. Since the transfer characteristics of the operational transconductance amplifier is quite predictable and is based on the bias current, a predictable relationship is maintained between phase shift and bias current. Conversion from current control to voltage control would require in its simplest form a resistor from the current input node to the control voltage source. Use of a single transistor as a simple conversion stage would allow an ultra-wide dynamic range. All that is essential is a variable transconductance amplifier to receive that current as its bias current input to controllably phase shift a signal transferred from the circuit input terminal 12 to the circuit output terminal 17. The noninverting unity gain amplifier 11 may be eliminated in other embodiments besides that illustrated by FIG. 8 as shown in FIG. 9. Since the function of that buffer amplifier is to provide a low output impedance for the filter circuit, and a very high impedance load for the output of the transconductance amplifier, the buffer amplifier may be eliminated in any application where the impedance presented to the transconductance amplifier by the load is sufficiently high.

From the foregoing it is evident that the low-pass filter can be built in either an inverting or a noninverting configuration. If separate signals are applied simultaneously to both input terminals of the differential input stage, the low-pass filter can process both signals and yield the difference. In other words, the low-pass filter built in a differential configuration may have either or neither of its two input signals at zero (circuit ground). This is particularly useful when low-pass filters are cascaded. The input signal is applied to the non-inverting input of the first filter, and the output signal from the final filter is fed back to the inverting input terminal of the first filter. If four low-pass filters are cascaded, there will be a resonance in the response, which is variable in degree by the amount of feedback. The reason for the resonance is that the phase shift at $\omega = I_b K/C$ is $4 \times 45° = 180°$, which is positive feedback. It is also evident that all of the filters disclosed herein may be cascaded in any of the configurations, mixed or matched, to obtain virtually any filter function with wide range control over all frequency and phase determining parameters. In those configurations having the noninverting input terminal of the transconductance amplifier connected to circuit ground, the practice is to use a resistor for the connection, the value of the resistor being equal to the impedance seen by the inverting input terminal at the node *b*. As this is often quite low, the noninverting terminal is connected directly to ground as shown in the drawings, but a resistor may be used in keeping with standard practice without departing from the present invention.

Although particular embodiments of the invention have been described and illustrated herein, it is recognized that modifications and variations may readily occur to those skilled in the art. It is therefore invented that the claims be interpreted to cover such modifications and variations.

The embodiments of the invention in which an exclusive property or privilege is claimed are defined as follows:

1. A circuit for dynamic control of phase shift of a signal between input and output terminals thereof comprising a variable tranconductance amplifier, said transconductance amplifier having a differential input stage with separate inverting and noninverting input terminals, and a current source output stage, a capacitor connected between the output of said transconductance amplifier and said circuit input terminal to receive a signal from the output of said transconductance amplifier, means for coupling a signal from said circuit input terminal to an input terminal of said transconductance amplifier, a noninverting buffer amplifier having high input impedance for coupling the output of said transconductance amplifier to said circuit output terminal, a direct current path between said circuit output terminal and said inverting input terminal of said transconductance amplifier for coupling negative feedback from the output of said transconductance amplifier to an input thereof, and means for supplying a variable control bias current to said amplifier for phase shift monotonically related to said bias current, said noninverting input terminal of said transconductance amplifier being connected to circuit ground and said inverting input terminal being connected to said negative feedback coupling means.

2. A circuit as defined in claim 1 wherein said output terminal of said buffer amplifier is connected to said inverting input terminal of said transconductance amplifier through a voltage dividing network comprised of a series resistor connected to said inverting input terminal of said transconductance amplifier, and a shunt resistor connected between said inverting input terminal and circuit ground.

3. A circuit as defined in claim 2 wherein said circuit input terminal is connected to said inverting input terminal of said transconductance amplifier by a series resistor.

4. A circuit for dynamic control of phase shift of a signal between input and output terminals thereof comprising a variable transconductance amplifier, a capacitor connected between the output of said transconductance amplifier and said circuit input terminal to receive a signal from the output of said transconductance amplifier, means for coupling a signal from said circuit input terminal to an input terminal of said transconductance amplifier, means for coupling the output of said transconductance amplifier to said circuit output terminal, means for coupling negative feedback from the output of said transconductance amplifier to an input thereof, and means for supplying a variable control bias current to said amplifier for a phase shift monotonically related to said bias current, said transconductance amplifier having a differential input stage with separate inverting and noninverting input terminals, and a current source output stage, said inverting input terminal being connected to circuit ground through a shunt resistor and being connected to receive said negative feedback through a series resistor, said noninverting input terminal being connected to circuit ground, and said circuit input terminal being connected to said inverting input terminal through a series resistor.

5. A circuit for dynamic control of phase shift of a signal between input and output terminals thereof comprising a variable transconductance amplifier having a differential input stage with separate inverting and noninverting input terminals, and a current source output stage, said noninverting input terminal being connected to circuit ground, a capacitor connected in series between said circuit input terminal and the output of said transconductance amplifier, impedance matching means for coupling the output of said amplifier to said circuit output terminal comprised of a noninverting buffer amplifier having high input impedance, means for coupling negative feedback from the output of said transconductance amplifier to the input thereof comprised of a direct current path between said circuit output terminal and said inverting input terminal of said transconductance amplifier, and means for supplying a variable control bias current to said amplifier for a phase shift of said signal translated by said circuit from said input terminal to said output terminal.

6. A circuit as defined in claim 5 wherein said output terminal of said buffer amplifier is connected to said inverting input terminal of said differential input stage of said transconductance amplifier through a voltage dividing network comprised of a series resistor connected to said inverting input terminal of said transconductance amplifier, and a shunt resistor connected between said inverting input terminal and circuit ground.

7. A circuit as defined in claim 5 wherein said negative feedback coupling means is comprised of a direct connection from said current source output stage to said inverting input terminal of said transconductance amplifier.

* * * * *